(12) United States Patent
Hirata et al.

(10) Patent No.: US 7,282,174 B2
(45) Date of Patent: Oct. 16, 2007

(54) LEAD-FREE SOLDER AND SOLDERED ARTICLE

(75) Inventors: Masahiko Hirata, Kashiba (JP);
Hisahiko Yoshida, Ibaraki (JP);
Takashi Nagashima, Kyoto (JP);
Toshihiko Taguchi, Saitama (JP);
Yoshitaka Toyoda, Satte (JP); Tsukasa Ohnishi, Souka (JP)

(73) Assignees: Senju Metal Industry Co., Ltd., Tokyo (JP); Matsushita Electric Industrial Co., Ltd, Kadoma (JP)

( * ) Notice: Subject to any disclaimer, the term of this patent is extended or adjusted under 35 U.S.C. 154(b) by 0 days.

(21) Appl. No.: 10/533,288

(22) PCT Filed: Oct. 31, 2003

(86) PCT No.: PCT/JP03/13996

§ 371 (c)(1),
(2), (4) Date: Nov. 3, 2005

(87) PCT Pub. No.: WO2004/039533

PCT Pub. Date: May 13, 2004

(65) Prior Publication Data

US 2006/0102690 A1    May 18, 2006

(30) Foreign Application Priority Data

Oct. 31, 2002    (JP) .............................. 2002-317121

(51) Int. Cl.
*B23K 35/26*    (2006.01)

(52) U.S. Cl. .................. 420/562; 148/400; 148/23; 148/26

(58) Field of Classification Search ............... 148/400, 148/23, 26; 420/560–562
See application file for complete search history.

(56) References Cited

FOREIGN PATENT DOCUMENTS

| | | |
|---|---|---|
| DE | 560281 | 9/1932 |
| EP | 0 622151 | 11/1994 |
| EP | 0 649703 | 4/1995 |
| EP | 0 855242 | 7/1998 |
| EP | 1 142666 | 10/2001 |
| GB | 516503 | 1/1940 |
| JP | 09-019790 | * 1/1977 |
| JP | 59 189096 | 10/1984 |
| JP | 06087090 | * 3/1994 |
| JP | 08 019892 | 1/1996 |
| JP | 08132279 | * 5/1996 |
| JP | 08-243782 | * 9/1996 |
| JP | 08 243782 | 9/1996 |
| JP | 08 267270 | 10/1996 |
| JP | 08 323495 | 10/1996 |
| JP | 09 019790 | 1/1997 |
| JP | 09 085484 | 3/1997 |
| JP | 09-085484 | * 3/1997 |
| JP | 09 094687 | 4/1997 |
| JP | 09 094688 | 4/1997 |
| JP | 09-174278 | * 7/1997 |
| JP | 09 174278 | 7/1997 |
| JP | 2 914214 | 4/1999 |
| JP | 2000 015478 | 1/2000 |

* cited by examiner

*Primary Examiner*—Sikyin Ip
(74) *Attorney, Agent, or Firm*—Michael Tobias

(57) ABSTRACT

The present invention provides a Sn—Zn based lead-free solder which can prevent peeling of solder from soldered portions even after the passage of long periods after soldering of portions to be soldered made of Cu. A Sn—Zn based lead-free solder according to the present invention comprises 5-10 mass percent of Zn, a total of 0.005-1.0 mass percent of at least one substance selected from the group consisting of Au, Pt, Pd, Fe, and Sb, optionally a total of at most 15 mass percent of at least one substance selected from the group consisting of Bi and In, and a remainder of Sn. This Sn—Zn based lead-free solder can be made into a solder paste using a rosin flux containing a halide such as an amine hydrochloride as an activator.

14 Claims, No Drawings

LEAD-FREE SOLDER AND SOLDERED ARTICLE

TECHNICAL FIELD

This invention relates to a lead-free solder and solder paste suitable for use in soldering electronic equipment and a soldered article using them.

BACKGROUND ART

A solder which has been used from long in the past is a Sn—Pb alloy. A eutectic solder having a composition of Pb-63Sn has been much used, particularly for soldering of electronic equipment. Since this Sn-63Pb eutectic solder has good wettability and spreadability with respect to the surface of a metal to be soldered, it has the excellent advantages that it produces few defects at the time of soldering such as unsoldered portions, voids, or bridges, and that reliable soldered joints are obtained.

This solder has a eutectic composition, and it has the important advantage that its solidus temperature and liquidus temperature are the same, and each temperature, i.e., the melting point is as low as 183° C. In general, in soldering of electronic equipment, soldering is carried out by melting at a temperature of 30-50° C. above the liquidus temperature. Accordingly, when using the above-described eutectic solder, the soldering temperature is 210-230° C. At a soldering temperature of this order, soldering is carried out without thermal effects on electronic parts or printed circuit boards which are sensitive to heat. From this standpoint as well, a eutectic solder with a melting point of 183° C. has excellent reliability.

For the above reasons, a Sn-63Pb eutectic solder is extensively used in electronic equipment for soldering when mounting electronic parts on printed circuit boards or when soldering elements to substrates within electronic parts.

When electronic equipment becomes old and becomes inconvenient to use or breaks, it is often disposed of by being discarded. When electronic equipment is discarded, parts made of a single material such as frames made of metal, cases made of plastic, and displays made of glass can easily be recovered and reused as resources. However, it is difficult to reutilize printed circuit boards in which the resins in insulating materials and the metals in conductors or solder are bonded to each in a complicated shape, so they are usually disposed of by burial. If acid rain which seeps into the ground contacts printed circuit boards which have been disposed of by burial, the lead in the solder is dissolved out by the acid rain and is mixed into underground water. If underground water containing lead is drunk by humans or livestock over a long period, lead accumulates within the body, and there is the danger of lead poisoning eventually taking place. Therefore, the use of lead is being restricted on a worldwide scale, and so-called lead-free solder which does not contain lead has come to be used.

Lead-free solder is solder having Sn as a main component, to which Ag, Cu, Bi, In, Zn, Ni, Cr, P, Ge, Ga, and the like are suitably added.

Conventional lead-free solders are binary alloys such as Sn—Ag, Sn—Cu, Sn—Sb, Sn—Bi, Sn—In, and Sn—Zn having Sn as a main component, or multi-element alloys in which other elements are added to these binary alloys.

Among these, Sn—Ag based alloys and Sn—Cu based alloys are the most widely utilized lead-free solders on account of having excellent mechanical strength compared to Sn-63Pb eutectic solder. However, almost all of these lead-free solders have a liquidus temperature of at least 220° C., and the solidus temperature is 217° C. even for the tertiary eutectic composition of Sn—Ag—Cu having the lowest solidus temperature, and this is significantly higher than that of a Pb-63Sn eutectic solder. Accordingly, the soldering temperature when using a Sn—Ag based or Sn—Cu based lead-free solder becomes at least 250° C., and a deterioration in performance or thermal damage may result in electronic parts and printed circuit boards. A Sn—Sb based lead-free solder also has a high liquidus temperature of at least 240° C., and it has problems with respect to thermal effects on electronic parts and the like.

A Sn—In lead-free solder has a Sn-52In eutectic composition with a eutectic temperature at 117° C. This Sn—In lead-free solder has a lower melting point than a Pb-63Sn eutectic solder, and thermal effects on electronic parts and printed circuit boards can be even further reduced. However, if the melting point of solder is too low, it may lead to problems after soldering. For example, at the time of use of electronic equipment, coils, power transistors, resistors, and the like generate heat, and if such heat-generating parts are soldered with a solder having too low a melting point, the solder may melt due to the generated heat, or even if it does not melt, its mechanical strength decreases, and it can be easily peeled off with a small force. In addition, the amount of In which is produced is small, and it an element for which there is a possibility of its supply on earth being exhausted, so it is extremely expensive. Therefore, the addition of large amounts of In is undesirable from the standpoint of economy.

A Sn—Bi lead-free solder has a Sn-58Bi eutectic composition with a eutectic temperature of 139° C. In the same manner as the above-described Sn—In lead-free solder, this Sn—Bi lead-free solder has a melting point which is too low, and it is not suited for soldering of electronic parts which generate heat. In addition, Bi itself has the property of being extremely brittle, and a Sn—Bi lead-free solder which contains a large amount of Bi has the problem that peeling easily takes place if an impact is applied after soldering.

A Sn—Zn based lead-free solder has a Sn-9Zn eutectic composition with a eutectic temperature of 199° C. This eutectic temperature (melting point) is fairly close to the melting point (183° C.) of the above-described Pb-63Sn eutectic solder. Accordingly, when a Sn—Zn based lead-free solder is used for soldering many types of electronic equipment which have used Pb-63Sn eutectic solder, thermal problems, i.e., problems of thermal damage to electronic parts or easy peeling due to the generation of heat after soldering of heat-generating parts do not readily take place. Moreover, Zn is inexpensive, and it is an element contained in the human body and it has little adverse effect on the human body. Under these circumstances, Sn—Zn based lead-free solders have recently been studied more extensively.

With Sn—Zn based lead-free solders, the wettability of a binary Sn—Zn alloy is not sufficient, and unsoldered portions, voids, and the like occur. For this reason, from in the past, there have been many proposals of Sn—Zn based lead-free solders having improved wettability by the addition of one or more metals such as Ag, Cu, or Ni to Sn—Zn (see Japanese Published Unexamined Patent Applications Hei 8-267270, 9-94687, and 9-94688).

A Sn—Zn based lead-free solder having a composition close to a Sn—Zn eutectic composition has a liquidus temperature of around 200° C., and the temperature difference from the melting point of a Pb-63Sn eutectic solder is 17° C. Therefore, when performing soldering with a Sn—Zn based lead-free solder of electronic parts which from a temperature standpoint can just barely be soldered with a Pb-63Sn eutectic solder, this temperature difference of 17° C. (the soldering temperature is 17° C. higher) can be a problem. For this reason, there is sometimes a demand for a lead-free solder having a composition close to a Sn—Zn eutectic composition and having a liquidus temperature close to the melting point of a Pb-63Sn eutectic solder. Accordingly, there have been proposals of Sn—Zn based lead-free solders to which Bi or In, each of which has the effect of lowering the melting point of solder, has been added (see Japanese Patent No. 2914214, and Japanese Published Unexamined Patent Applications Hei 8-19892, 8-323495, and 9-19790).

DISCLOSURE OF THE INVENTION

During the course of long periods of use of electronic equipment which has been soldered using a Sn—Zn based lead-free solder, the bonding strength of soldered portions decreases, and there were cases in which peeling of the solder occurred with the application of a small force or in which peeling occurred even when no force whatsoever was being applied. This phenomenon is particularly marked when portions being soldered are made of Cu or when the flux contains a halide as an activator.

The present invention provides a Sn—Zn based lead-free solder which decreases or eliminates this problem, i.e., peeling of soldered portions does not readily take place in soldered electronic equipment during long periods of use thereof even when portions are made of Cu or when the flux contains halides.

The present inventors studied the cause of why parts which are soldered with a Sn—Zn based lead-free solder readily undergo peeling, and they found that when portions being soldered (namely, leads of electronic parts or lands of printed circuit boards) are made of Cu, the interface of the portions being soldered (the Cu/solder interface) is corroded, and peeling of the solder occurs. The mechanism of this peeling is conjectured to be as follows.

If portions made of Cu are soldered with a Sn—Zn based lead-free solder, the Zn in the Sn—Zn based lead-free solder reacts with Cu in preference to Sn, and a Cu—Zn intermetallic compound is formed in the interface of the soldered portion. Subsequently, the Zn in the Cu—Zn intermetallic compound which is exposed to the outside of the soldered portion undergoes corrosive oxidation by moisture and oxygen in the air, and it loses its metallic properties. This corrosive oxidation of Zn starts with Cu—Zn intermetallic compounds exposed to the outside of the soldered portion, and it progresses by propagating to the internal Cu—Zn intermetallic compounds. Bonding between the solder and the Cu base metal is obtained by metallic bonding (alloying) between the molten metal component of the solder and the Cu, but when the Zn in the Cu—Zn intermetallic compound in the interface of the soldered portion loses its metallic properties, the solder can no longer be metallically bonded to the Cu portions, and the solder ends up peeling from the Cu portions (the portions being soldered).

This corrosive oxidation of Zn is further promoted and the progress of peeling of solder is accelerated when flux residue containing a halide as an activator adheres to portions being soldered because halides absorb moisture from the air and become a strongly corrosive liquid.

When electronic parts are soldered, portions to be soldered are often made of Cu, and activated fluxes often contains halides as activators. Thus, when electronic parts are soldered using a Sn—Zn based lead-free solder, it becomes easy for peeling of solder to occur. Accordingly, if corrosive oxidation of Zn present in the interface of portions being soldered can be prevented, peeling of solder during long periods of use of electronic equipment can be prevented, even though electronic parts are soldered using a Sn—Zn based lead-free solder.

The present inventors found that if a certain type of metal is contained in Cu—Zn intermetallic compounds which are formed in the interface of portions being soldered, the metal penetrates into the Cu—Zn intermetallic compounds and can suppress the corrosive oxidation of Zn.

Specifically, the present invention is a lead-free solder comprising 5-10 mass percent of Zn, a total of 0.005-1.0 mass percent of at least one substance selected from the group consisting of Au, Pt, Pd, Fe, and Sb, optionally a total of at most 15 mass percent of at least one substance selected from the group consisting of Bi and In, and a remainder of Sn.

The present invention also relates to a solder paste formed by mixing a powder of the above-described Sn—Zn based lead-free solder and a flux component, and to a soldered article having been soldered using the above-described Sn—Zn based lead-free solder. This soldered article is preferably a printed circuit board on which an electronic part is mounted by soldering. In order to obtain the effects of the present invention, in the case of the printed circuit board, the portions to be soldered of at least one of the electronic part and the printed circuit board are preferably made of Cu.

BEST MODE FOR CARRYING OUT THE INVENTION

The Zn content of a Sn—Zn based lead-free solder according to the present invention is 5-10 mass percent, which is close to that of a Sn—Zn eutectic, in order to make the melting point as low as possible. If the Zn content is smaller than 5 mass percent or greater than 10 mass percent, the liquidus temperature of the solder becomes high, and it becomes necessary to increase the soldering temperature. A preferred Zn content of a Sn—Zn based lead-free solder according to the present invention is 7-9.5 mass percent.

Metals which can suppress the corrosive oxidation of Zn when added to a Sn—Zn based lead-free solder by penetrating into a Cu—Zn intermetallic compound are Au, Fe, Pt, Pd, and Sb. These metals will also be referred to as corrosion suppressing metals. A Sn—Zn based lead-free solder according to the present invention contains at least one of these corrosion suppressing metals. The content of the corrosion suppressing metal (the total amount when two or more are added) is 0.005-1.0 mass percent. If the content of the corrosion suppressing metal is smaller than 0.005 mass percent, the effect of suppressing corrosive oxidation of Zn cannot be exhibited, while if it exceeds 1.0 mass percent, not only does the melting point abruptly increase, but solderability becomes impaired. The total content of the corrosion suppressing metal is preferably 0.01-0.7 mass percent.

When it is desired to lower the liquidus temperature of a Sn—Zn based lead-free solder according to the present invention to the vicinity of 183° C., for example, which is the melting point of a Pb-63Sn eutectic solder, one or both of Bi and In which have an effect of lowering the melting point can be added. In this case, the content of Bi and/or In (the total content when Bi and In are added) is set so as not to exceed 15 mass percent. If the content of Bi and/or In is greater than 15 mass percent, the eutectic temperature of Sn—Bi which is 139° C. or the eutectic temperature of Sn—In which is 117° C. have a very significant effect, the liquidus temperature of the Sn—Zn based lead-free solder becomes too low, and when heat-generating parts are soldered, the strength of solder may be lowered by heat generated by the parts. In order to fully obtain the effect of lowering the melting temperature, the content of Bi and/or In is preferably at least 0.5 mass percent and particularly at least 2 mass percent. A preferred upper limit on the content of Bi and/or In is 12 mass percent.

The remainder of a Sn—Zn based lead-free solder according to the present invention is Sn, but it may include unavoidable impurities permissible in solder and particularly in solder for soldering of electronic parts.

There is no particular restriction on the form of a Sn—Zn based lead-free solder according to the present invention. It can be a solid solder such as rod solder, wire solder, flux-cored solder, preforms, or solder balls.

In an embodiment of the present invention, this Sn—Zn based lead-free solder is in the form of a solder paste formed by blending solder powder and a paste-like flux component and uniformly mixing them. In general, the content of flux in a solder paste is approximately 5-15 mass percent.

The flux component of this solder paste may be a usual rosin flux. A rosin flux has rosin as a main component and also contains a solvent, an activator, and a thickener (a thixotropic agent). A rosin flux used in a solder paste according to the present invention may be an activated rosin flux containing a small amount of a halide (such as an amine hydrochloride) which has a strong activating action but which generates a corrosive acid. In a Sn—Zn based lead-free solder according to the present invention, oxidizing corrosion of Zn is suppressed by the addition of a corrosion suppressing metal. Even if the rosin flux contains a halide, therefore, peeling of solder due to oxidizing corrosion of Zn can be effectively prevented.

With a conventional Sn—Zn based lead-free solder, if a portion being soldered is made of Cu, the Zn in the solder forms an intermetallic compound with the Cu in the portion being soldered, and due to the oxidizing corrosion thereof, it becomes easy for peeling of solder to occur. In particular, when flux residue in the form of halides remains in the vicinity of portions being soldered, as is observed when carrying out soldering using a solder paste containing the above-described activated rosin flux, oxidizing corrosion of Zn is accelerated, and it becomes easier for peeling of solder to occur. Therefore, with a conventional Sn—Zn based lead-free solder, it was thought that the occurrence of peeling at soldered portions after soldering was unavoidable.

When a Sn—Zn based lead-free solder according to the present invention is used, oxidizing corrosion of Zn does not take place even if the portions to be soldered of electronic parts or printed circuit boards are made of Cu or if a flux residue containing halides remains. Accordingly, the present invention is particularly suitable for use in soldering of electronic parts and printed circuit boards when the portions to be soldered of at least one of these articles is made of Cu. In addition, even when a flux containing an activator such as an amine hydrochloride is used for soldering, corrosion is not promoted by flux residue any more. As a result, a soldered article is provided which has resistance to oxidizing corrosion, with which soldered portions can maintain a stable condition over long periods, and with which peeling of solder does not occur. This soldered article provides the excellent effect not existing in the past that it can extend the lifespan of electronic equipment.

A Sn—Zn based lead-free solder according to the present invention can be used not only for reflow soldering using a solder paste but also for flow soldering methods including wave soldering and dip soldering and for reflow soldering using solder balls. Of course, it can also be used for other soldering methods such as soldering with a soldering iron. A flux containing a halide as an activator may also be used when carrying out soldering by a method not using a solder paste.

EXAMPLES

Examples and comparative examples of Sn—Zn based lead-free solders having the compositions shown in Table 1 were prepared, and the ease of oxidizing corrosion of Zn and soldered joint strength were investigated by the below-described corrosion test and QFP bonding strength test. The test results are also shown in Table 1.

Corrosion Test

Test piece: A test piece was prepared by soldering a tough-pitch copper plate measuring 0.3 mm×10 mm×15 mm by immersion to a depth of 15 mm for 5 seconds in a solder bath in which each solder alloy was melted by heating to 250° C.

Test method: The test piece was left for 1000 hours in a constant-temperature constant-humidity tank at a temperature of 85° C. and a relative humidity of 85%. Then it was embedded in an epoxy resin, a cross section was polished, and the presence or absence of oxidizing corrosion in the interface of the soldered portions was investigated with a scanning electron microscope and with an energy dispersion-type elemental analyzer.

Evaluation: Instances in which formation of an oxide layer due to corrosive oxidation in the interface of the soldered portions was not observed or when there was little formation of an oxide layer were considered acceptable, while instances in which there was much formation of an oxide layer due to corrosive oxidation in the interface of the soldered portions or when peeling in the interface was observed were considered unacceptable.

QFP Bonding Strength Test

Test piece: Solder pastes prepared using powder of each solder were applied by printing using a metal screen with a thickness of 0.15 mm to a printed circuit board with Cu wiring in a pattern for QFP's with a pitch of 0.65 mm. After QFP's were mounted thereon, the solder paste was melted by reflow heating to carry out soldering and prepare a test piece. The solder pastes were prepared by blending in fixed proportions a powder of each solder manufactured by the gas atomizing method (average particular diameter: approximately 40 micrometers) and a rosin flux containing an amine hydrochloride as an activator.

Test method: The test piece was left for 1000 hours in a constant-temperature constant-humidity tank with a temperature of 85° C. and a relative humidity of 85%, and the bonding strength (N) was measured by engaging a hook with a joint portion of each QFP and carrying out a tensile test at an angle of 45°.

TABLE 1

| | | Alloy composition of solder (mass %) | | | | | | | | | Corrosion test | QFP bonding strength test(N) | |
|---|---|---|---|---|---|---|---|---|---|---|---|---|---|
| | | | | | | | | | | | | | After |
| | | Sn | Zn | Bi | In | Au | Fe | Pt | Pd | Sb | Other | | Initial | 1000 hours |
| Present Invention | 1 | Rem. | 9 | | | 0.01 | | | | | | Acceptable | 26.3 | 16.8 |
| | 2 | Rem. | 9 | | | 0.1 | | | | | | Acceptable | 27.8 | 17.5 |
| | 3 | Rem. | 9 | | | | 0.01 | | | | | Acceptable | 26.5 | 19.8 |
| | 4 | Rem. | 9 | | | | 0.1 | | | | | Acceptable | 28.3 | 23.5 |
| | 5 | Rem. | 9 | | | | | 0.005 | | | | Acceptable | 25.8 | 17.8 |
| | 6 | Rem. | 9 | | | | | 0.1 | | | | Acceptable | 27.9 | 24.1 |
| | 7 | Rem. | 9 | | | | | | 0.005 | | | Acceptable | 26.0 | 18.1 |
| | 8 | Rem. | 9 | | | | | | 0.1 | | | Acceptable | 27.7 | 23.9 |
| | 9 | Rem. | 9 | | | | | | | 0.1 | | Acceptable | 27.1 | 24.7 |
| | 10 | Rem. | 9 | | | | | | | 1 | | Acceptable | 28.6 | 26.5 |
| | 11 | Rem. | 8 | 3 | | 0.05 | | | | | | Acceptable | 28.7 | 19.5 |
| | 12 | Rem. | 8 | 3 | | | 0.05 | | | | | Acceptable | 28.8 | 21.0 |
| | 13 | Rem. | 8 | 3 | | | | 0.05 | | | | Acceptable | 29.0 | 19.7 |
| | 14 | Rem. | 8 | 3 | | | | | 0.05 | | | Acceptable | 28.6 | 20.5 |
| | 15 | Rem. | 8 | 3 | | | | | | 0.5 | | Acceptable | 30.0 | 27.1 |
| | 16 | Rem. | 5 | 10 | | | | 0.05 | | | | Acceptable | 22.5 | 15.8 |
| | 17 | Rem. | 5 | | 10 | | | 0.05 | | | | Acceptable | 24.6 | 17.2 |
| | 18 | Rem. | 5 | 5 | 5 | | | 0.05 | | | | Acceptable | 23.9 | 16.3 |
| Compar. | 1 | Rem. | 9 | | | | | | | | | Unacceptable | 25.7 | 10.5 |
| | 2 | Rem. | 7 | 5 | 8 | | | | | | | Unacceptable | 23.6 | 8.6 |
| | 3 | Rem. | 5 | 13 | 3 | | | | | | | Unacceptable | 20.2 | 5.7 |
| | 4 | Rem. | 7 | | | | | | | | Cu: 0.5 | Unacceptable | 26.4 | 9.5 |

As can be seen from Table 1, the Sn—Zn based lead-free solders according to the present invention containing at least one corrosion suppressing metal selected from Au, Pt, Pd, Fe, and Sb had absolutely no peeling of solder in a corrosion test using a flux containing a halide as an activator, and the formation of an oxide layer was also suppressed. In contrast, with any of the comparative examples of Sn—Zn based lead-free solders which did not contain such a corrosion suppressing metal, there was peeling of solder or marked formation of an oxide layer in the corrosion test.

In the QFP bonding strength test, the Sn—Zn based lead-free solders according to the present invention exhibited a bonding strength of at least 15 N even after 1000 hours, and even at the lowest level, they maintained at least 60% of their initial strength after 1000 hours, and the decrease in bonding strength after the passage of a long time was small. In contrast, the comparative examples of Sn—Zn based lead-free solders had a low bonding strength after 1000 hours of at most 10.5 N, and the strength after 1000 hours decreased to 40-13% of the initial strength, so the percent decrease in the bonding strength after 1000 hours was extremely large. In addition, with the comparative examples of solders, the mode of failure in the tensile test after 1000 hours was in each case peeling at the interface, but in the examples, the mode of failure was failure inside the solder. From this result as well, it can be seen that with a Sn—Zn based lead-free solder according to the present invention, the effect of effectively suppressing oxidizing corrosion in an interface and the bonding strength of solder are maintained at a high level after long periods of time.

In the above, the present invention was explained with the object of illustrating specific modes, but the present invention is not restricted thereto.

The invention claimed is:

1. A lead-free solder consisting of 5-10 mass percent of Zn, a total of 0.005-1.0 mass percent of at least one substance selected from the group consisting of Au, Pt, Pd, Fe, and Sb, 0.5-12 mass percent of Bi, and a remainder of Sn.

2. A lead-free solder as claimed in claim 1 consisting of 5-10 mass percent of Zn, a total of 0.005-1.0 mass percent of at least one substance selected from the group consisting of 0.005-0.1 mass percent of Au, 0.005-0.1 mass percent of Pt, 0.005-0.1 mass percent of Pd, 0.005-0.1 mass percent of Fe, and 0.005-1 mass percent of Sb, 0.5-12 mass percent of Bi, and a remainder of Sn.

3. A lead-free solder as claimed in claim 2 consisting of 5-10 mass percent of Zn, 0.005-1.0 mass percent of Sb, 0.5-12 mass percent of Bi, and a remainder of Sn.

4. A solder paste formed by mixing a powder of a lead-free solder as claimed in claim 2 with a flux component.

5. A solder paste as claimed in claim 4 wherein the flux component is a rosin flux.

6. A solder paste as claimed in claim 5 wherein the rosin flux contains a halide.

7. A soldered article having a soldered portion which is soldered by a lead-free solder as claimed in claim 2.

8. A soldered article as claimed in claim 7 wherein the soldered article is a printed circuit board having an electronic part mounted thereon by soldering.

9. A soldered article as claimed in claim 8 wherein at least one of the electronic part and the printed circuit board has a soldered portion made of Cu.

10. A lead-free solder as claimed in claim 1 including at least one of Pt, Pd, and Au.

11. A lead-free solder as claimed in claim 2 including Fe.

12. A lead-free solder as claimed in claim 2 consisting of 5-10 mass percent of Zn, at least one substance selected from the group consisting of 0.005-0.1 mass percent of Au, 0.005-0.1 mass percent of Pt, and 0.005-0.1 mass percent of Pd, 0.5-12 mass percent of Bi, and a remainder of Sn.

13. A lead-free solder as claimed in claim 1 including at least 2 mass percent of Bi.

14. A lead-free solder as claimed in claim 13 including at most 10 mass percent of Bi.

* * * * *